United States Patent
Chu et al.

(10) Patent No.: US 6,425,951 B1
(45) Date of Patent: Jul. 30, 2002

(54) ADVANCE INTEGRATED CHEMICAL VAPOR DEPOSITION (AICVD) FOR SEMICONDUCTOR

(75) Inventors: Jack Oon Chu, Astoria; Khalid Ezzeldin Ismail, Yorktown Heights, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/369,995

(22) Filed: Aug. 6, 1999

Related U.S. Application Data

(62) Division of application No. 09/025,889, filed on Feb. 18, 1998, now Pat. No. 6,013,134.

(51) Int. Cl.$^7$ .............................................. C30B 33/06
(52) U.S. Cl. .............................. 117/3; 117/88; 117/89; 117/93
(58) Field of Search ................................ 117/3, 88, 89, 117/93, 104, 935

(56) References Cited

U.S. PATENT DOCUMENTS

| | | | |
|---|---|---|---|
| 4,498,416 A | 2/1985 | Bouchaib ..................... 118/719 |
| 4,696,702 A | * 9/1987 | Ellis, Jr. et al. ............. 438/482 |
| 4,816,098 A | 3/1989 | Davis et al. ................. 156/345 |
| 4,822,756 A | 4/1989 | Hirayama ..................... 438/765 |
| 4,951,601 A | 8/1990 | Maydan et al. ............. 118/719 |
| 5,000,113 A | 3/1991 | Wang et al. ................ 118/723 |
| 5,043,299 A | 8/1991 | Chang et al. ................ 437/192 |
| 5,121,705 A | 6/1992 | Sugino ....................... 118/719 |
| 5,244,841 A | 9/1993 | Marks et al. ................ 437/228 |
| 5,259,881 A | 11/1993 | Edwards et al. ............. 118/719 |
| 5,292,393 A | 3/1994 | Maydan et al. .............. 156/345 |
| 5,298,452 A | 3/1994 | Meyerson ..................... 437/81 |
| 5,302,209 A | 4/1994 | Maeda et al. ............... 118/719 |
| 5,314,538 A | 5/1994 | Maeda et al. ............... 118/715 |
| 5,354,715 A | 10/1994 | Wang et al. ................ 437/238 |
| 5,362,526 A | 11/1994 | Wang et al. ................ 427/573 |
| 5,378,651 A | * 1/1995 | Agnello et al. ............. 438/489 |
| 5,407,485 A | 4/1995 | Takagi ....................... 118/724 |
| 5,423,914 A | 6/1995 | Nakamura et al. .......... 118/719 |
| 5,482,557 A | 1/1996 | Kanai et al. ................ 118/719 |
| 5,512,320 A | 4/1996 | Turner et al. ............... 427/255 |
| 5,534,713 A | 7/1996 | Ismail et al. ................. 257/24 |
| 5,611,861 A | 3/1997 | Higashi ...................... 118/719 |
| 5,613,821 A | 3/1997 | Muka et al. ................ 414/217 |
| 5,888,909 A | * 3/1999 | Hara .......................... 438/778 |

OTHER PUBLICATIONS

Wolf, S. and Tauber, R.N., "Silicon Processing for the VLSI Era, vol. 1—Process Technology" (Sunset Beach CA: lattice Press): 177–178, 1986.*
E. de Fresart et al., "Wafer Cassette Turntable for Multi–Wafer Integrated Processing", IBM Technical Disclosure Bulletin, vol. 31, No. 9, Feb. 1989, pp. 268–270.

* cited by examiner

*Primary Examiner*—Benjamin L. Utech
*Assistant Examiner*—Binh X. Tran
(74) *Attorney, Agent, or Firm*—Robert M Trepp

(57) ABSTRACT

An apparatus for forming a portion of an electronic device is described incorporating an Ultra High Vacuum-Chemical Vapor Deposition (UHV-CVD) system, a Low Pressure-Chemical Vapor Deposition (LP-CVD) system, and an Ultra High Vacuum (UHV) transfer system. A method for passivating a semiconductor substrate is described incorporating growing silicon containing layers, flowing a hydrogen containing gas and lowering the substrate temperature below 400° C. A method for removing native oxide is described. A method for growing a continuous epitaxial layer while performing a deposition interrupt is described. A method for forming a Si/Si oxide interface is described having low interface trap density. A method for forming a Si/Si oxide/p++ polysilicon gate stack. The invention overcomes the problem of requiring silicon containing wafers being dipped in HF acid prior to CVD processing. The invention overcomes the problem of surface passivation between in-situ processes in multiple CVD reactors.

13 Claims, 4 Drawing Sheets

ADVANCE INTEGRATED CHEMICAL VAPOR DEPOSITION (AICVD) FOR SEMICONDUCTOR

This is a division of application Ser. No. 09/025,889, filed Feb. 18, 1998, issued Jan. 11, 2000 as U.S. Pat. No. 6,013,134.

FIELD OF THE INVENTION

This invention relates to semiconductor process equipment and more particularly, to Chemical Vapor Deposition apparatus for performing a plurality of in-situ processes for forming all or portions of an electronic device.

BACKGROUND OF THE INVENTION

Present Chemical Vapor Deposition Equipment consists of a single or multiple chambers, gas inlets, gas outlets, vacuum pumps and transfer load-lock systems for inserting, for example, semiconductor wafers into the chamber. Prior art examples of Chemical Vapor Deposition Equipment is described in U.S. Pat. No. 5,298,452 by B. S. Meyerson which issued on Mar. 29, 1994 which shows an Ultra High Vacuum Chemical Vapor Deposition (UHV-CVD) reactor with a vacuum loading apparatus.

An example of a cluster CVD system which is for single wafer processing with preheating and uniform temperature control is described in U.S. Pat. No. 5,259,881 by Edwards et al. which issued on Nov. 9, 1993.

In the growth of Si structures or Si/SiGe heterostructures via UHV-CVD processing, a critical step and requirement before loading wafers into the UHV-CVD equipment is to perform a dip of each Si containing wafer into HF acid to remove the native oxide from the wafer surface and to passivate the Si bonds at the surface with hydrogen. Si containing wafers after being dipped in HF acid are loaded into a vacuum loading apparatus of a CVD reactor and then inserted into the CVD reactor. This particular ex-situ HF cleaning procedure without a water rinse is a hazardous practice to be performed manually under a chemical hood and moreover, for patterned wafers, often there is residual HF liquid left on the wafer surface which would require additional $N_2$ blowing of the residual HF off the wafer. Blowing residual liquid HF is an extremely hazardous manual process. Presently, this HF-dip is not an industry acceptable process and weakens the acceptance of the UHV-CVD processing technique for doing low temperature epitaxy in the semiconductor manufacturing industry.

Another key issue related to making high performance Si and/or Si/SiGe Metal Oxide Silicon (MOS) field effect transistor (FET) structures and/or Complementary Metal Oxide Silicon (CMOS) is the requirement for a very high quality gate dielectric and a gate electrode stack as described in U.S. Pat. No. 5,534,713 by K. Ismail et al. which issued Jul. 9, 1996. This patent describes a gate dielectric of an ultra-thin $SiO_2$ layer with a thickness from 1 nm to 5 nm. The gate electrode is a heavily doped polysilicon structure.

SUMMARY OF THE INVENTION

In accordance with the present invention, an apparatus is described for forming the semiconductor portion of CMOS, MODFET's, MOSFET's, HEMT's etc. along with any desired gate structure such as an ultra thin gate oxide together with a heavily doped polysilicon gate electrode layer to be subsequently patterned comprising an Ultra High Vacuum-Chemical Vapor Deposition System (UHV-CVD), a Low Pressure CVD (LP-CVD), and an UHV transfer system for loading wafers from the external ambient and for transferring wafers from UHV-CVD to LP-CVD and vice versa under UHV pressures. A separate load-lock could be provided for transfer of wafers from the external ambient to an UHV transfer system where the UHV transfer system would remain at vacuum pressures.

The invention further provides an apparatus for performing a plurality of processes comprising a first UHV-CVD system, a second CVD system positioned above the first UHV-CVD system, a transfer system for transferring semiconductor wafers between the first and second systems under UHV pressure, wherein the UHV transfer system includes an elevator mechanism for raising and lowering the semiconductor wafers from one CVD system or reactor to the other.

The invention further provides an apparatus for performing a plurality of processes comprising a first UHV-CVD system, a second CVD system positioned horizontally beside the first UHV-CVD system, a transfer system for transferring semiconductor wafers between the first and second systems under UHV pressure, wherein the transfer system includes a mechanism for moving the semiconductor wafers from one CVD system or reactor to the other.

The invention further provides a method for passivating a silicon containing surface on a substrate comprising the steps of placing the substrate in a reactor, prebaking the substrate surface in hydrogen, growing a silicon containing layer with a first gas, switching the first gas to a second gas such as $SiH_4$ or $Si_2H_6$, and reducing the growth temperature to below 400° C. The surface passivation with hydrogen is hydrophobic and serves to prevent any surface oxidation to occur.

The invention further provides a method for continuous epitaxial growth on a semiconductor substrate in a reactor comprising the steps of growing an epitaxial layer on the semiconductor substrate under first growth conditions, interrupting the growth of the epitaxial layer, passivating the surface of the substrate with hydrogen such as by flowing $SiH_4$ or $Si_2H_6$ while lowering the substrate surface temperature below 400° C.

The invention further provides changing the first growth conditions to second growth conditions in the reactor and restarting continuous growth on the surface of the epitaxial layer under the second growth conditions such as by raising the temperature of the substrate above 400° C.

The invention further provides a method for continuous epitaxial growth on a semiconductor substrate in a plurality of reactors comprising the steps of growing an epitaxial layer in a first reactor, interrupting the growth of the epitaxial layer, passivating the surface of the substrate such as by lowering the temperature of the substrate below 400° C. with hydrogen such as by flowing $SiH_4$ or $Si_2H_6$, transferring the substrate to a second reactor while maintaining a controlled gaseous environment and pressure between reactors and restarting continuous growth on the surface of the epitaxial layer in the second reactor such as by flowing a silicon containing gas and raising the temperature of the substrate above 400° C. The controlled gaseous environment herein is an environment that may include hydrogen and excluding contaminants such as $O_2$, $CO_2$, CO, $H_2O$, $CH_4$, and other hydrocarbons and gases such as mentioned in U.S. Pat. No. 5,298,452 as contaminants which is incorporated herein by reference. The partial pressure of all contaminants are maintained at pressures below $10^8$ Torr.

The invention further provides a method for forming a silicon/silicon oxide interface with low interface traps comprising the steps of growing a silicon containing layer on a substrate with a first gas in a first CVD reactor, switching the first gas to a second gas such as $SiH_4$ or $Si_2H_6$ to passivate the surface of the substrate with hydrogen terminated Si bonds, reducing the temperature from the growth temperature to below 400° C., transferring the substrate to a second CVD reactor while maintaining a controlled gaseous environment and pressure between CVD reactors and growing a silicon oxide layer on the passivated surface.

The invention further provides a method for fabricating silicon containing epitaxial layers comprising the steps of placing a semiconductor substrate into a first CVD reactor, removing any native oxide from the surface of the semiconductor substrate by baking in the range from 850° C. to 900° C. for about 30 minutes in the first CVD reactor with hydrogen gas flowing in the first CVD reactor, forming a medium/high temperature silicon containing epitaxy layer on the surface of the semiconductor substrate in the range from 600° C. to 900° C. in the first CVD reactor, flowing a hydrogen containing gas in the first CVD reactor, reducing the growth temperature in the range from 400° C. to 350° C. whereby the surface of the semiconductor substrate is hydrogen terminated, transferring the semiconductor substrate to a second UHV-CVD reactor under a controlled gaseous environment, and forming epitaxial layers on the semiconductor substrate suitable for the channel of a FET. Next, the semiconductor substrate may be transferred to a third CVD reactor under a controlled gaseous environment, forming a gate oxide on the upper surface of the semiconductor substrate, transferring the semiconductor substrate to a fourth CVD reactor under a controlled gaseous environment, and forming a heavily doped n or p type polysilicon gate electrode layer over the gate oxide. The n or p type doping may be in the range from $1 \times 10^{20}$ to $1 \times 10^{21}$ atoms/cm$^3$. The first and third CVD reactor may be the same one. The second and fourth CVD reactor may be the same one.

The invention further provides a method for forming two successive processes comprising the steps of placing a semiconductor substrate into a CVD reactor, performing a first process, passivating the surface of the semiconductor substrate, removing the semiconductor substrate from the CVD reactor, purging the CVD reactor with hydrogen, reintroducing the semiconductor substrate into the CVD reactor while maintaining the semiconductor substrate below 400° C., and performing a second process. The first and second processes may including growing Si containing layers with different compositions, dopants, growth conditions etc.

BRIEF DESCRIPTION OF THE DRAWING

These and other features, objects, and advantages of the present invention will become apparent upon consideration of the following detailed description of the invention when read in conjunction with the drawing in which.

DESCRIPTION OF THE PREFERRED EMBODIMENTS

Figure 1:
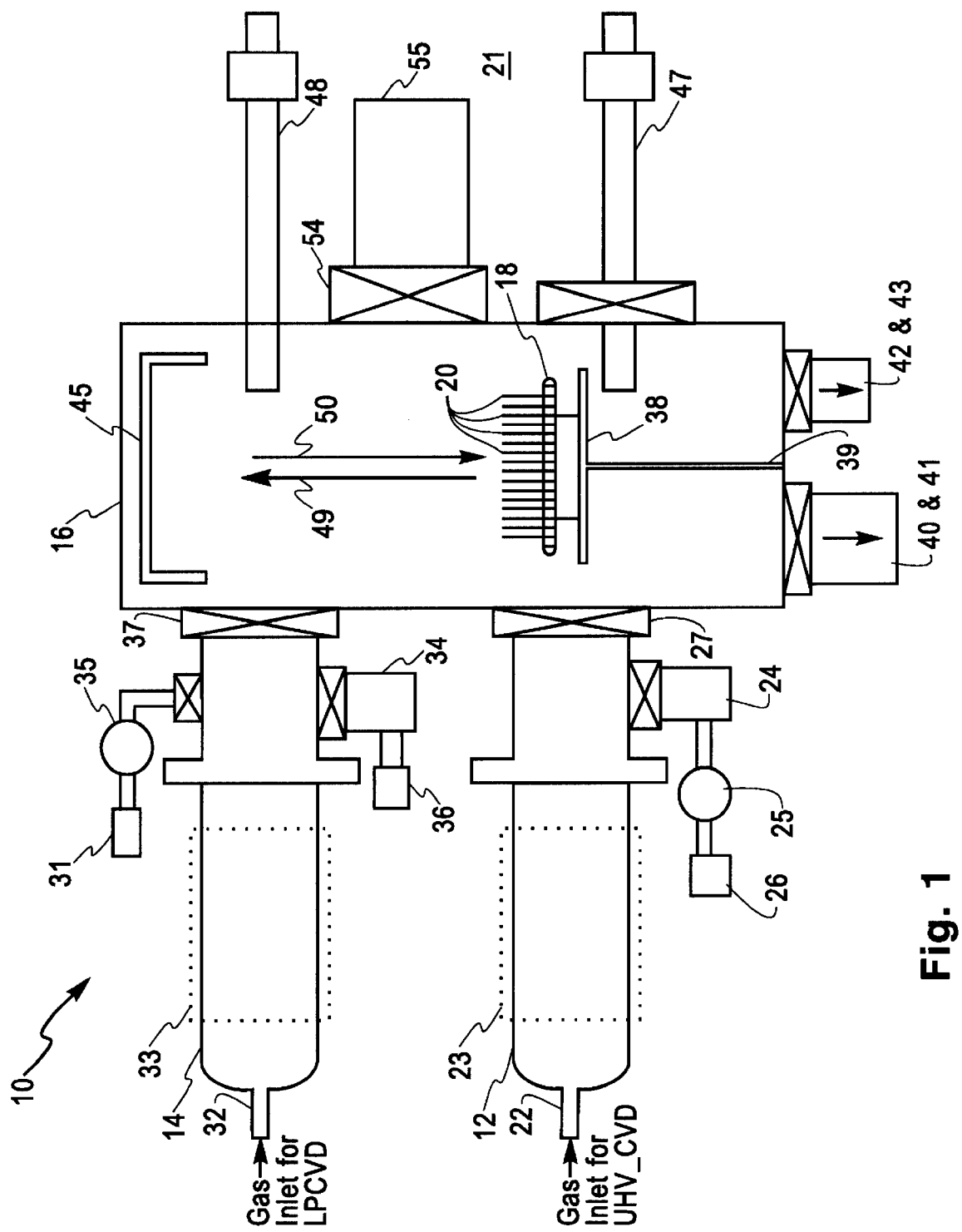
FIG. 1 is a first embodiment of the invention.

Referring now to the drawing, FIG. 1 shows an advanced integrated chemical vapor deposition (AICVD) system 10 comprising a UHV-CVD system 12 and a UHV-LPCVD system 14 coupled to a UHV transfer system 16 for moving boats 18 filled with wafers 20 between systems 12 and 14. Transfer system 16 may serve as a load lock for transferring boats 18 with wafers 20 to the external ambient. UHV-CVD system 12 includes a gas inlet 22, furnace 23, turbomolecular pump 24, Roots Blower 25, mechanical pump 26 and gate valve 27. UHV-LPCVD system 14 includes a gas inlet 32, furnace 33, turbomolecular pump 34 followed by a mechanical pump 36, a Roots blower 35 followed by a mechanical pump 31, and gate valve 37.

As shown in FIG. 1, system 14 may be positioned above system 12 as a vertical system with a footprint of UHV-CVD system 12 and transfer system 16. Transfer system 16 may include an elevator platform 38, elevator mechanism 39, a turbomolecular pump 40 followed by a mechanical pump 41, a cryogenic pump 42 followed by a mechanical pump 43, a cold trap 45, push transfer systems 47 and 48. Elevator mechanism 39 functions to raise and lower elevator platform 38 as shown by arrows 49 and 50 to position boat 18 opposite the opening of gate valves 27 and 37 for movement of boat 18 into respective systems 12 and 14 by way of respective push transfer systems 47 and 48.

Transfer system 16 functions to provide a pressure in the range from UHV such as a base pressure of $10^{-9}$ Torr, to atmosphere with a selected gas environment. Preferably, a separate gate valve 54 and load lock 55 would provide a means for moving boats 18 from the external ambient 21 outside system 10 to the interior of transfer system 16. Transfer system 16 may then be maintained at low pressure or UHV during loading of wafers on boats 18.

Alternatively, FIG. 1 may be viewed with system 12 on the same horizontal level as system 14 such as side by side. Transfer system 16 would be horizontal with elevator platform 38 also being horizontal with elevator mechanism 39 functioning to move platform 38 in front of the opening of gate valves 27 and 37. The footprint of system 10 will be considerably larger which would include additional area due to the space between system 12 and 14 as well as the area of system 14.

Advanced integrated chemical vapor deposition system 10 is based upon growth interrupt experiments and results which indicate that continuous growth of a silicon containing layer after an interruption in growth conditions is possible without any material quality degradation as long as wafer 20 has surface passivation which is maintained throughout the growth interrupt period and/or during a wafer transfer process such as between the UHV-LPCVD and the UHV-CVD chambers. Wafer 20 surface passivation is believed to be the termination of atomic bonds on the surface such as Si bonds with hydrogen.

Figure 2:
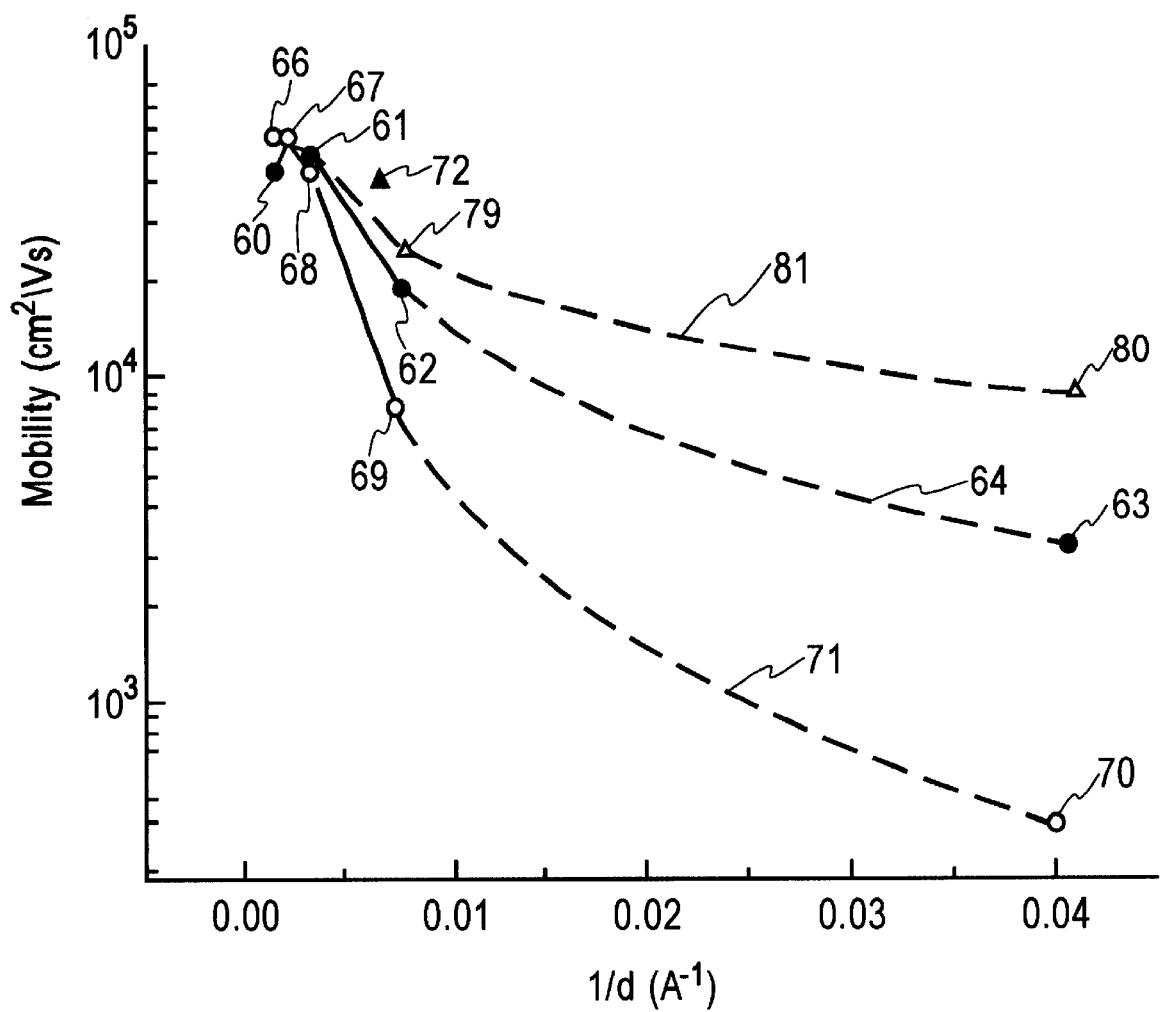
FIG. 2 is a graph of the mobility versus 1/d where d is the separation distance between the center of the active channel and the actual growth interrupt interface.

The results of growth interrupt experiments are shown in FIG. 2. FIG. 2 is a plot of the measured electron mobility for a 2 dimension electron gas (DEG) in a tensely-strained Si channel versus one over the separation distance d, where d is the separation distance between the center of the active channel of a future MOS transistor and the actual growth interrupt interface. The channel thickness subsequently formed was in the range from 50Å to 65Å. The growth interrupt interface precedes the formation of the active channel. The growth interrupt interface is located below the active channel. In FIG. 2, the ordinate represents mobility in cm$^2$/Vs and the abscissa represents one over d in Å$^{-1}$.

In FIG. 2, data points 60–63 correspond to measurements made on a first wafer where the growth interrupt of a silicon containing layer was accomplished by removing the wafer during growth of the silicon containing layer from the UHV-CVD chamber while the wafer was above 450° C. at the growth temperature $T_1$. The first wafer was removed into a controlled ambient of hydrogen. Curve 64 connects data points 60–63. The active channel of tensely strained Si was subsequently grown above the interrupt interface.

In FIG. 2, data points 66–70 corresponds to measurements made on a second wafer where the growth interrupt of a silicon containing layer was accomplished by removing the wafer during growth of the silicon containing layer from the UHV-CVD chamber while the wafer was above 450° C. at the growth temperature $T_2$ where $T_2$ is greater than the temperature $T_1$. The second wafer was removed into a controlled ambient of hydrogen. Curve 71 connects data points 66–70.

In FIG. 2, data point 72 corresponds to the measurement of the first wafer where the growth interrupt of a silicon containing layer was accomplished by cooling the first wafer in the UHV-CVD chamber below 400° C. while passivating the wafer surface by flowing silane ($SiH_4$) thereover while it was cooled and then removing the first wafer from the UHV-CVD chamber into a controlled ambient of hydrogen. Data point 72 has a higher mobility, about two times greater than data point 62. Data point 72 is about $4\times10^4$ cm$^2$/Vs and data point 62 is about $2\times10^4$ cm$^2$/Vs.

In FIG. 2, data points 79 and 80 corresponds to the measurement of the second wafer where the growth interrupt of a silicon containing layer was accomplished by cooling the second wafer in the UHV-CVD chamber below 400° C. while passivating the wafer surface by flowing silane ($SiH_4$) thereover while it was being cooled from the growth temperature and then removing the second wafer from the UHV-CVD chamber into a controlled ambient of hydrogen. Curve 81 connects data points 79 and 80. Data point 79 has a higher mobility than data point 69. Data point 79 is about $2.5\times10^4$ cm$^2$/Vs and data point 69 is about $8\times10^3$ cm$^2$/Vs and was taken at d equals about 155 Å. Data point 80 has a higher mobility than data point 70. Data point 80 is about $1.1\times10^4$ cm$^2$/Vs and data point 70 is about $5.5\times10^2$ cm$^2$/Vs and was taken at d equals about 25 Å.

FIG. 2 shows that a minimum distance d of about 500 Å (corresponding to 1/d of 0.002 on the abscissa) could be tolerated before any material quality degradation is observed resulting in a reduced carrier mobility. The minimal distance d of 500 Å would be with or without surface passivation prior to removing the wafers from the UHV-CVD chamber. In other words, there is no degradation of the electron mobility within the Si Channel when the growth interrupt occurs at a distance of more than 500 Å below the Si Channel at 500° C.

It is believed that this minimal distance d of 500 Å could be smaller. In this experiment the growth interrupt period which occurred at a temperature of 500° C. was for a total of 1 hour while in a realistic, practical wafer transfer process, one would want to minimize the transfer and/or interrupt time as much as possible, for example a total of 5 minutes. By reducing the transfer and/or interrupt period, more hydrogen will remain bonded to the surface and the loss of hydrogen passivation will be reduced.

However as shown in FIG. 2, passivating the wafer surface and cooling the wafer below 400° C. prior to removal of the wafers always results in improved carrier mobility when d is less than 500 Å.

Figure 3:
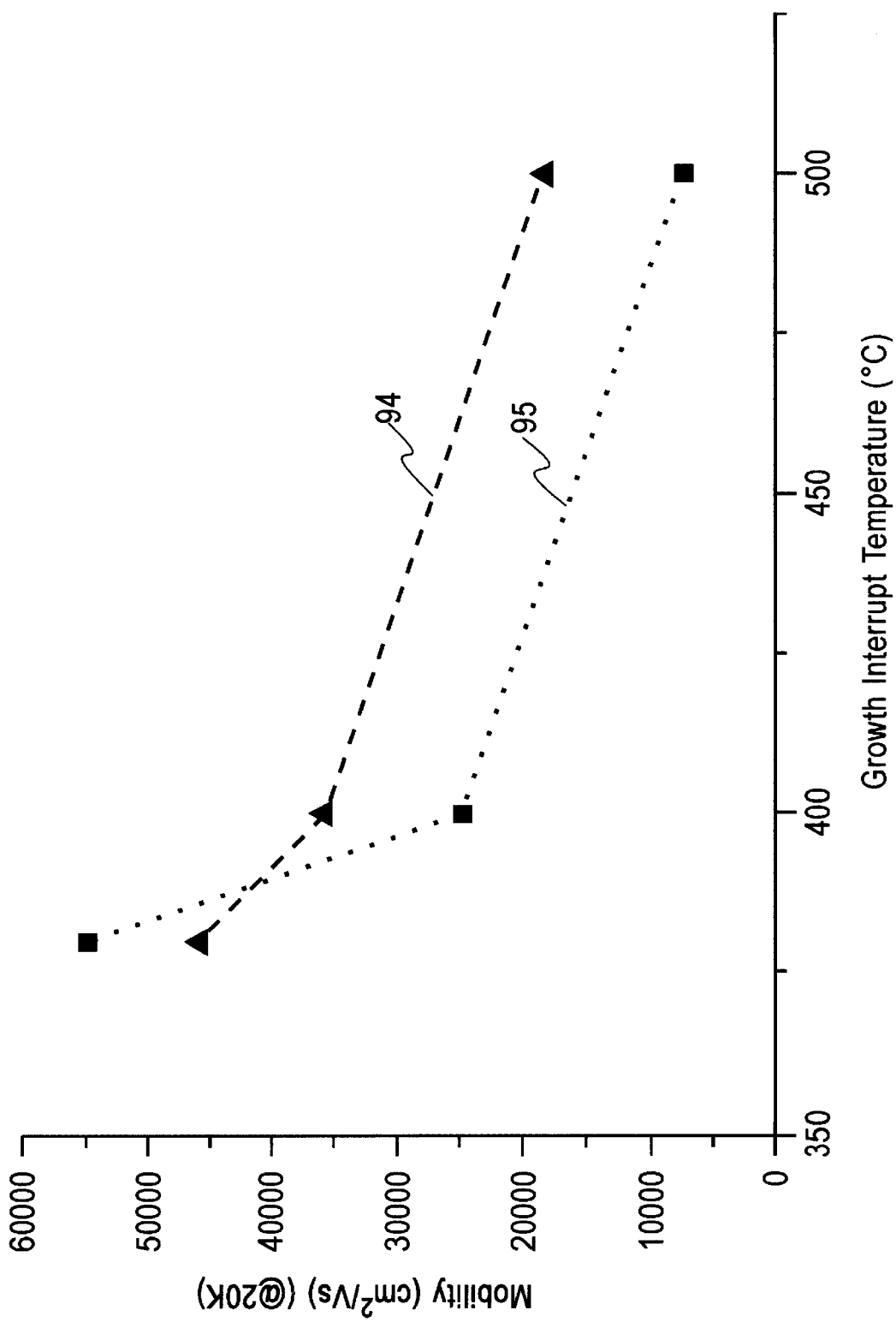
FIG. 3 is a graph of the mobility versus growth interrupt temperature.

Referring to FIG. 3, the effect of growth interrupt temperature on mobility is shown. In FIG. 3, the ordinate represents Mobility in cm$^2$/Vs and the abscissa represents growth interrupt temperature in °C. In FIG. 3, curves 94 and 95 show that by lowering the growth interrupt temperature from 500° C. to 380° C. at a distance d of 100 Å, there is again no ostensible mobility degradation. Curves 94 and 95 indicate that a minimal distance of about 100 Å is acceptable for processing when the growth interrupt temperature is set at 380° C.

In operation of AICVD system 10, wafers which may have some native or chemical oxide thereon are loaded into UHV-LPCVD system 14 to first remove the native oxide from the silicon or silicon containing surface by employing a $H_2$ pre-bake at a temperature in range from 800° C. to 950° C. for 10 to 30 minutes. Immediately after pre-bake, a silicon containing gas is flowed through UHV-LPCVD 14 at a medium/high temperature of 750° C. to 850° C. to immediately grow a medium/high temperature silicon epitaxy layer after which the growth temperature is dropped (as quickly as possible) below 450° C. thereby leaving the growth interface on the silicon containing surface hydrogen-terminated. At this point, the in-situ cleaning of wafers surfaces have been completed and a hydrogen surface passivation is generated whereby the wafers are now ready to be transferred to the UHV-CVD chamber 12. The foregoing steps therefore replace the ex-situ step of dipping wafers in HF acid mentioned above.

Figure 4:
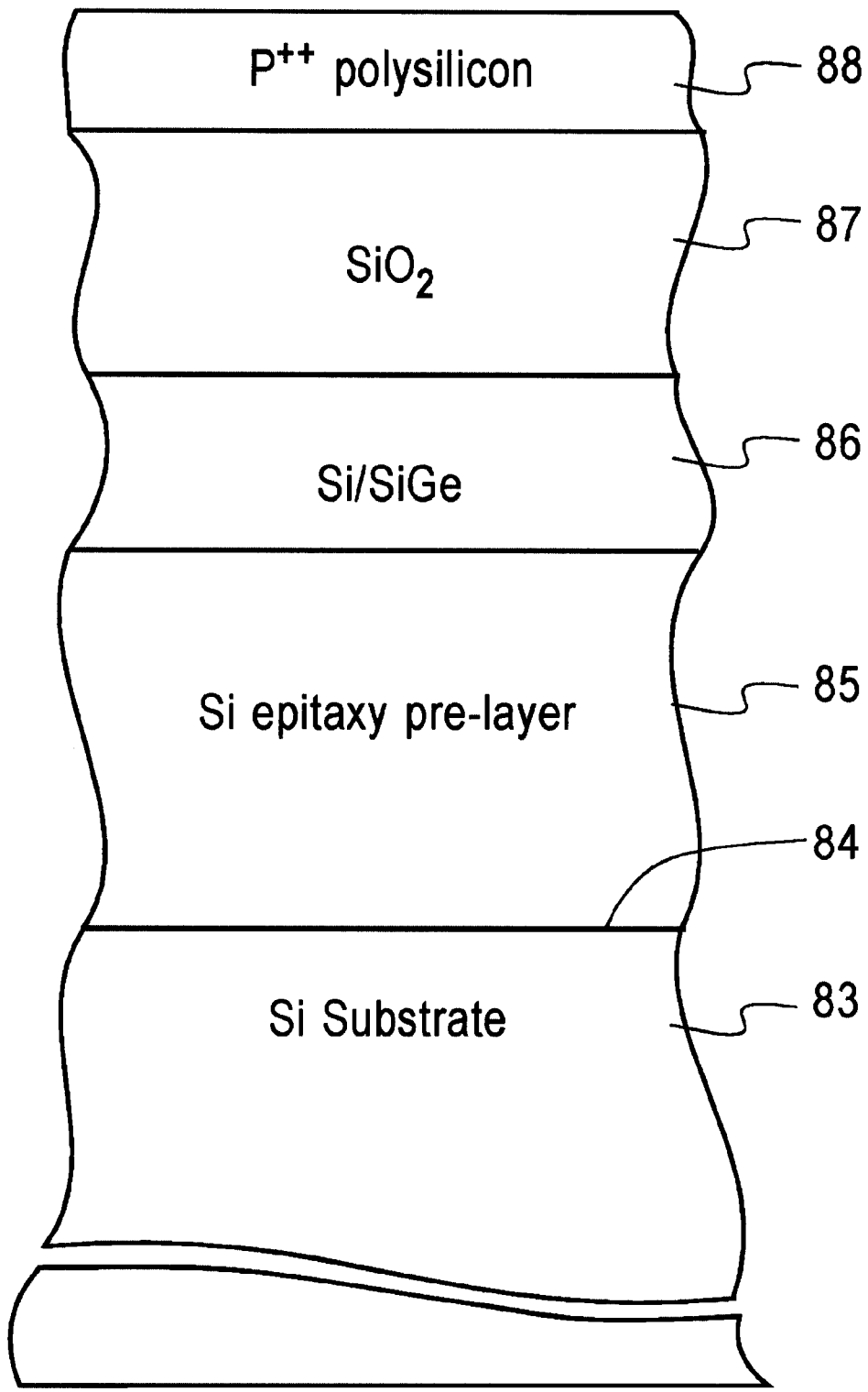
FIG. 4 is a second embodiment of the invention.

In UHV-CVD chamber 12, the entire Si and/or SiGe CMOS device structure may be formed as shown in FIG. 4. The CMOS device structure may be composed of a graded up structure as described in U.S. Pat. No. 5,534,713 by Ismail et al. which is incorporated herein by reference followed by both the p- and n- type modulation doped structures which can now be grown over the passivated surface of the silicon containing layer using UHV-CVD processing. Now, since these active device channels are at least 5,000 Å from the actual growth interface which is 100 times more than required, there will be no degradation whatsoever to be expected in the device performance from these SiGe CMOS heterostructures.

After completion of the Si and/or SiGe CMOS device structures wafers 20 can now be transferred up to the UHV-LPCVD 14 where a gate oxide in the range from 1 nm to 5 nm can be grown in the low temperature range from 400° C. to 650° C. With the gate oxide process completed in UHV-LPCVD 14, wafers 20 are then transferred back into UHV-CVD 12 where a heavily doped p++ polysilicon gate layer may be grown over the thin gate oxide which will serve to maintain the oxide quality and thickness uniformity as well as a completed gate stack structure.

A standard polysilicon layer could also be grown using UHV-LPCVD 14, however, the very high in-situ boron doping levels ranging from $10^{20}$ to $10^{21}$ atoms/cm$^3$ are not readily achievable in a LPCVD. However in AICVD 10, integrated processing procedures may be used for fabricating any high performance Si and/or SiGe device structure with a high quality gate stack.

EXAMPLE 1

A method of operation for AICVD system 10 would provide the following processes to fabricate any high performance Si and/or SiGe device structure such as shown in FIG. 4.

1) Start with wafers 20 with a Si substrate 83 outside of AICVD 10 and clean wafers 20 with the standard Huang or RCA cleaning process well known in the art.
2) Load wafers 20 which may be on boat 18 into transfer chamber 16 and transfer wafers 20 on boat 18 into UHV-LPCVD system 14.

3) Pre-bake wafers 20 in the range from 800° C. to 900° C. for 10 to 30 minutes with H$_2$ flowing in UHV-LPCVD 14 to remove the native oxide from silicon surface 84.

4) Grow a medium temperature silicon epitaxial layer 85 in the range from 700° C. to 800° C. to thickness in the range from 100 Å to 300 Å using dichlorosilane (DCS) as the source gas.

5) Switch the DCS source gas flow to silane gas flow and then drop the growth temperature to below 400° C.

6) Turn off the silane gas flow and begin H$_2$ gas flow, transfer wafers 20 to transfer chamber 16 and then close off UHV-CVD system 14 from transfer chamber 16. Now, under a H$_2$ flow in UHV-CVD system 12, open UHV-CVD chamber system 12 to transfer chamber 16 and load wafers 20 which are on boat 18 into UHV-CVD system 12.

7) Operate UHV-CVD system 12 such as described in U.S. Pat. No. 5,298,452 Mar. 29, 1994 by B. S. Meyerson and mentioned above which is incorporated herein by reference to grow a desired Si, Ge and/or SiGe layer 86 to provide a device structure. When layer 86 is completed, start H$_2$ flowing in UHv-CVD system 12 and transfer wafers 20 to transfer system 16 and then close off UHV-CVD system 12 from transfer system 16.

8) While flowing H$_2$ in UHV-LPCVD system 14, open system 14 to transfer system 16 and load wafers 20 into UHV-LPCVD system 14 to grow a low temperature gate oxide.

9) Grow a low-temperature gate oxide layer 86 at a temperature in the range from 400° C. to 650° C. using mixtures of SiH$_4$ with NO$_2$ or O$_2$ and then transfer wafers 20 back into transfer system 16 when completed and close off UHV-LPCVD system 14. A silicon dioxide layer may be formed using tetra ethyl ortho silicate (TEOS) which is well known in the art.

10) Under H$_2$ flow in UHV-CVD system 12, open UHV-CVD system 12 to transfer system 16 and load wafers 20 back into UHV-CVD system 12 and grow a p+ or p++ polysilicon gate layer 88.

While there has been described and illustrated an advanced integrated chemical vapor deposition for fabricating semiconductor devices with processes in-situ and with interrupted growth of semiconductor layers, it will be apparent to those skilled in the art that modifications and variations are possible without deviating from the broad scope of the invention which shall be limited solely by the scope of the claims appended hereto.

Having thus described our invention, what we claim as new and desire to secure by Letters Patent is:

1. A method for in-situ passivating a silicon containing surface in a CVD system comprising the steps of growing an epitaxial silicon containing semiconductor layer on a substrate at a growth temperature to form said silicon containing surface, flowing a gas selected from the group consisting of SiH$_4$ and Si$_2$H$_6$, and during said step of flowing, lowering the temperature of said silicon containing surface below 400° C. whereby said silicon containing surface is passivated by hydrogen bonding to silicon at said silicon containing surface.

2. A method for growing a continuous epitaxial layer on a semiconductor substrate in a CVD system comprising the steps of growing a silicon containing layer on said substrate at first growth conditions to form a silicon containing surface, flowing a gas selected from the group consisting of SiH$_4$ and Si$_2$H$_6$, and lowering the temperature of said silicon containing surface below 400° C. whereby said silicon containing surface is passivated by hydrogen bonding to silicon on said silicon containing surface, changing the first growth conditions to second growth conditions in said CVD system and restarting continuous growth on said silicon containing surface of the epitaxial layer under the second growth conditions by raising the temperature of the substrate surface above 400° C.

3. The method of claim 2 further including the steps of removing the substrate from the CVD system after the step of lowering the temperature, purging the CVD system with hydrogen to remove dopant impurities including the step of raising the temperature of said CVD system above 800° C., cooling the CVD system below 400° C., and re-positioning the substrate in the CVD system.

4. A method for growing a continuous epitaxial layer on a semiconductor substrate in a plurality of reactors comprising the steps of:
growing a silicon containing epitaxial layer in a first reactor,
interrupting the growth of said epitaxial layer,
flowing a gas selected from the group consisting of SiH$_4$ and Si$_2$H$_6$ over said epitaxial layer,
lowering the temperature of said substrate below 400° C. whereby the surface of said substrate is passivated with hydrogen,
transferring said substrate to a second reactor while maintaining a controlled atmosphere and pressure between reactors, and
restarting continuous growth on the surface of said epitaxial layer in said second reactor such as by raising the temperature of said substrate above 400° C.

5. A method for forming a silicon containing semiconductor layer/silicon oxide layer interface with low interface traps comprising:
growing an epitaxial silicon containing semiconductor layer on a substrate with a first gas in a first CVD reactor,
switching said first gas to a second gas selected from the group consisting of SiH$_4$ and Si$_2$H$_6$ to passivate the surface of said epitaxial silicon containing semiconductor layer with hydrogen terminated Si bonds,
reducing the temperature of the surface of said silicon containing semiconductor layer to below 400° C.,
transferring said substrate and said epitaxial silicon containing semiconductor layer to a second CVD reactor while maintaining a controlled atmosphere and pressure between said first and second CVD reactors, and
growing a silicon oxide layer on the passivated surface of said epitaxial silicon containing semiconductor layer.

6. A method for fabricating silicon containing epitaxial layers comprising the steps of:
placing a semiconductor substrate into a first CVD reactor,
removing any native oxide from the surface of said semiconductor substrate including the step of baking in the range from 850° C. to 900° C. for about 30 minutes in said first CVD reactor with hydrogen gas flowing in said first CVD reactor,
forming a medium/high temperature silicon containing epitaxy layer on the surface of said semiconductor substrate at a temperature in the range from 600° C. to 900° C. in said first CVD reactor, and
flowing a hydrogen containing gas selected from the group consisting of SiH$_4$ and Si$_2$H$_6$ and during said step of flowing, reducing the temperature of the surface of said silicon containing epitaxy layer below 400° C. whereby silicon at said surface of said silicon containing epitaxy layer is hydrogen terminated.

7. A method for fabricating silicon containing epitaxial layers comprising the steps of:

placing a semiconductor substrate into a first CVD reactor, removing any native oxide from the surface of said semiconductor substrate including the step of baking in the range from 850° C. to 900° C. for about 30 minutes in said first CVD reactor with hydrogen gas flowing in said first CVD reactor, forming a medium/high temperature silicon containing epitaxy layer on the surface of said semiconductor substrate in the range from 600° C. to 900° C. in said first CVD reactor, flowing a hydrogen containing gas and reducing the temperature below 400° C. whereby the surface of said semiconductor substrate is hydrogen terminated, transferring the semiconductor substrate to a second UHV-CVD reactor under a controlled gaseous environment, and forming epitaxial layers on the semiconductor substrate suitable for the channel of a field effect transistor.

8. The method of claim 7 further including the steps of:

transferring the semiconductor substrate to a third CVD reactor under a controlled gaseous environment, forming a gate oxide on the upper surface of the semiconductor substrate, transferring said semiconductor substrate to a fourth CVD reactor under a controlled gaseous environment, and forming a heavily doped polysilicon gate electrode layer over the gate oxide.

9. The method of claim 8 wherein said heavily doped layer is one of n and p type and in the range from about $1 \times 10^{20}$ to about $1 \times 10^{21}$ atoms/cm$^3$.

10. The method of claim 8 wherein said first and third CVD reactors are a common CVD reactor.

11. The method of claim 8 wherein said second and fourth CVD reactors are a common CVD reactor.

12. A method for forming two successive processes comprising the steps of:

placing a silicon containing semiconductor substrate into a CVD reactor, performing a first process including the step of growing a first epitaxial silicon containing semiconductor layer, passivating the surface of said semiconductor substrate with hydrogen terminated Si bonds, said step of passivating including the step of flowing a gas selected from the group consisting of SiH$_4$ and Si$_2$H$_6$, lowering the temperature of said semiconductor substrate below 400° C., removing said silicon containing semiconductor substrate from said CVD reactor, purging said CVD reactor with hydrogen, reintroducing said silicon containing semiconductor substrate into said CVD reactor while maintaining said silicon containing semiconductor substrate below 400° C., and performing a second process including the step of growing a second epitaxial silicon containing semiconductor layer.

13. The method of claim 12 wherein said first and second processes include growing first and second epitaxial silicon containing semiconductor layers having at least one of different Si containing semiconductor layer compositions, different semiconductor dopants, and different Si containing semiconductor layer growth conditions.

* * * * *